United States Patent [19]

Lin et al.

[11] Patent Number: 5,669,768

[45] Date of Patent: Sep. 23, 1997

[54] APPARATUS FOR ADJUSTING A GAS INJECTOR OF FURNACE

[75] Inventors: Yu-Tsai Lin; Edward Houn, both of Miao-Li; Ben Chen, Hsinchu, all of Taiwan

[73] Assignee: United Microelectronics Corp., Hsinchu, Taiwan

[21] Appl. No.: 616,369

[22] Filed: Mar. 15, 1996

[51] Int. Cl.⁶ ........................................ F27B 5/04
[52] U.S. Cl. ..................... 432/205; 432/241; 432/200
[58] Field of Search ........................ 432/241, 205, 432/253, 152, 5, 6; 239/2.13; 169/70; 141/374, 386, 383, 372, 370, 369

[56] References Cited

U.S. PATENT DOCUMENTS 5,022,853  6/1991  Powell et al. .................. 432/200
5,247,972  9/1993  Tetreault ........................ 141/386

*Primary Examiner*—Henry A. Bennett
*Assistant Examiner*—Jiping Lu
*Attorney, Agent, or Firm*—Christensen O'Connor Johnson & Kindness PLLC

[57] ABSTRACT

An improved apparatus is provided for adjusting a gas injector of a furnace in connection with oxidation, diffusion and heat treating in semiconductor processing. The apparatus includes a reaction tube for serving as a reaction chamber and heat sink. The gas injector is coupled to the reaction tube on one end and includes openings on the other end for passing source gas. An elongated open tube is secured to the gas injector and has its axis superimposed approximately on the axis of the gas injector.

16 Claims, 4 Drawing Sheets

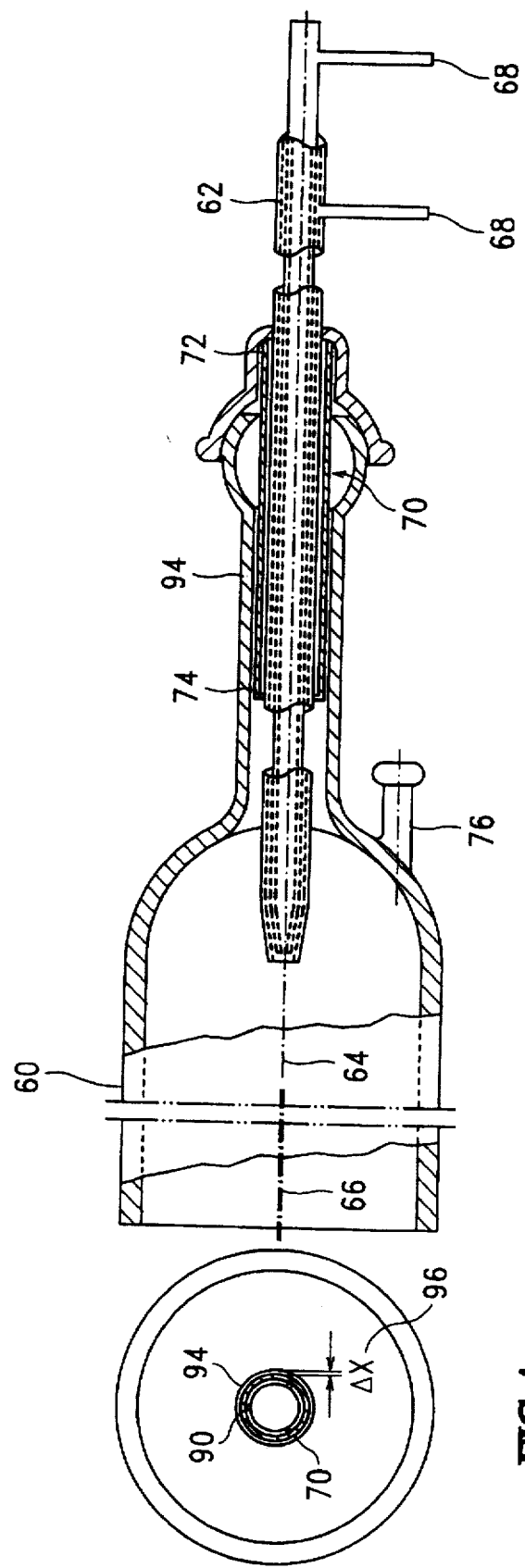

APPARATUS FOR ADJUSTING A GAS INJECTOR OF FURNACE

BACKGROUND OF THE INVENTION

1. Field of the Invention

The present invention relates generally to a furnace, and more particularly to an apparatus for quickly adjusting a gas injector of a furnace, which has been used in the semiconductor industry since the early 1960s for oxidation, diffusion and heat treating. The growth of silicon dioxide ($SiO_2$), one of the most commonly used layers in very large-scale integrated (VLSI) circuits, by thermal oxidation has made the furnace one of the mainstay equipments in the industry.

2. Description of the Prior Art

Virtually all modern metal oxide semiconductor (MOS) and bipolar integrated circuits utilize the furnace for oxidation, diffusion and heat treating. When a silicon surface is exposed to oxygen, there is growing silicon dioxide ($SiO_2$), a dielectric material used in a device to passify the silicon surface, to act as doping barrier and surface dielectric, and to serve as dielectric part of the device. Among the various possible uses of the furnace, heat treating is used as a follow-on operation, called annealing, to cure out crystal damage induced by the implant process, and as a critical operation, called flowing, to increase the adhesion of the dielectric material to the silicon surface.

A cross section of a typical furnace is shown in FIG. 1. The furnace includes a reaction tube 12, a gas injector 14 coupling to the reaction tube 12 on one end and having openings 16 on the other end for passing source gas, a coils 18 for supplying the desired temperature in the reaction tube 12, thermocouples 20 attached to the reaction tube for measuring and maintaining the desired process temperature, and an exhaust 22 for carrying the reacted gas out of the reaction tube 12. Inside the reaction tube 12 is a wafer boat 26 which serves as holder of wafers 24, and a wafer paddle 28 which supports the wafer boat 26 to load and unload the wafers 24 to and from the reaction tube 12.

The traditional material of the reaction tube 12, the gas injector 14 or the wafer boat 26 is high-purity quartz. Quartz is a highly purified glass favored for its inherent stability at high temperatures and its cleanliness. However, a drawback to quartz is its tendency to break up and sag at temperatures above 1200° C. An alternative material, which has limited use now due to its high cost and weight, is silicon carbide, which is structurally stronger and does not break down with repeated heating and cooling.

One way to grow a silicon dioxide layer on the silicon surface by thermal oxidation is to use oxygen and hydrogen through the gas injectors 16 at a temperature of about 900° to 1200° C. into the reaction tube 12 by the process, commonly called wet oxidation, shown below:

$$Si_{(solid)}+2H_2O_{(gas)} \rightarrow SiO_{2(solid)}+2H_{2(gas)}$$

where $H_2O$ is water vapor, which results from the reaction of oxygen and hydrogen inside the reaction tube 12, and the resultant hydrogen molecules ($H_2$) on the right side of the equation are trapped initially in the solid silicon dioxide ($SiO_2$) and then expelled after a heating of the silicon dioxide in an inert atmosphere.

Another way to grow a silicon dioxide layer on the silicon surface by thermal oxidation is to use only oxygen through the gas injector 16 at a temperature of about 900° to 1200° C. into the reaction tube 12 by the process, commonly called dry oxidation, shown below:

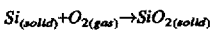

$$Si_{(solid)}+O_{2(gas)} \rightarrow SiO_{2(solid)}$$

This reaction is simpler and safer than wet oxidation, but requires a longer process time.

FIG. 2 shows the cross section of a typical arrangement of a gas injector 40 and a reaction tube 44. To prepare this arrangement for use, the gas injector 40 should be adjusted so its axis 42 is superimposed approximately on the axis 46 of the reaction tube 44. However, these two axes usually deviate from each other due to inaccuracy of adjustment. As illustrated in FIG. 3a, the axis 50 of the gas injector 40 moves upwardly by an angle a 52 with the axis 46 of the reaction tube 44. FIG. 3b shows another illustration wherein the axis 54 of the gas injector 40 moves downwardly by an angle b 56 with the axis 46 of the reaction tube 44.

Consequently, the thickness of the growing layers in or on the wafers inside a typical furnace is non-uniform, resulting in low reliability and yield of devices, and the preparation of the typical furnace before use is labor-consuming and difficult to maintain.

SUMMARY OF THE INVENTION

It is therefore a primary object of this invention to provide an improved apparatus for quickly adjusting a gas injector of a furnace, saving labor time and making maintainence simple.

It is another object of the invention to provide an improved apparatus for eliminating the problem of axial deviation due to inaccuracy of adjustment.

It is a further object of the invention to provide an improved apparatus for growing layers of good uniformity in or on the semiconductor wafers in order to increase the reliability and yield of products.

Accordingly, the present invention provides an apparatus for quickly adjusting a gas injector of a furnace in connection with oxidation, diffusion and heat treating in semiconductor processing. The apparatus includes a reaction tube for protecting wafers from outside contamination and serving as a heat sink to even out the temperature; a gas injector which has its axis superimposed approximately on the axis of the reaction tube, coupling to the reaction tube on one end and comprising openings on the other end for passing source gas; an open tube which has its axis superimposed approximately on the axis of the gas injector; a first end and a second end of the open tube being secured to the gas injector by soldering between them, and a thermocouple attached to the reaction tube for measuring and maintaining the desired process temperature.

BRIEF DESCRIPTION OF THE DRAWINGS

FIG. 4a is a side view of the invention.

FIG. 4b is a cross section of the invention.

DESCRIPTION OF THE PREFERRED EMBODIMENT

Figure 1:
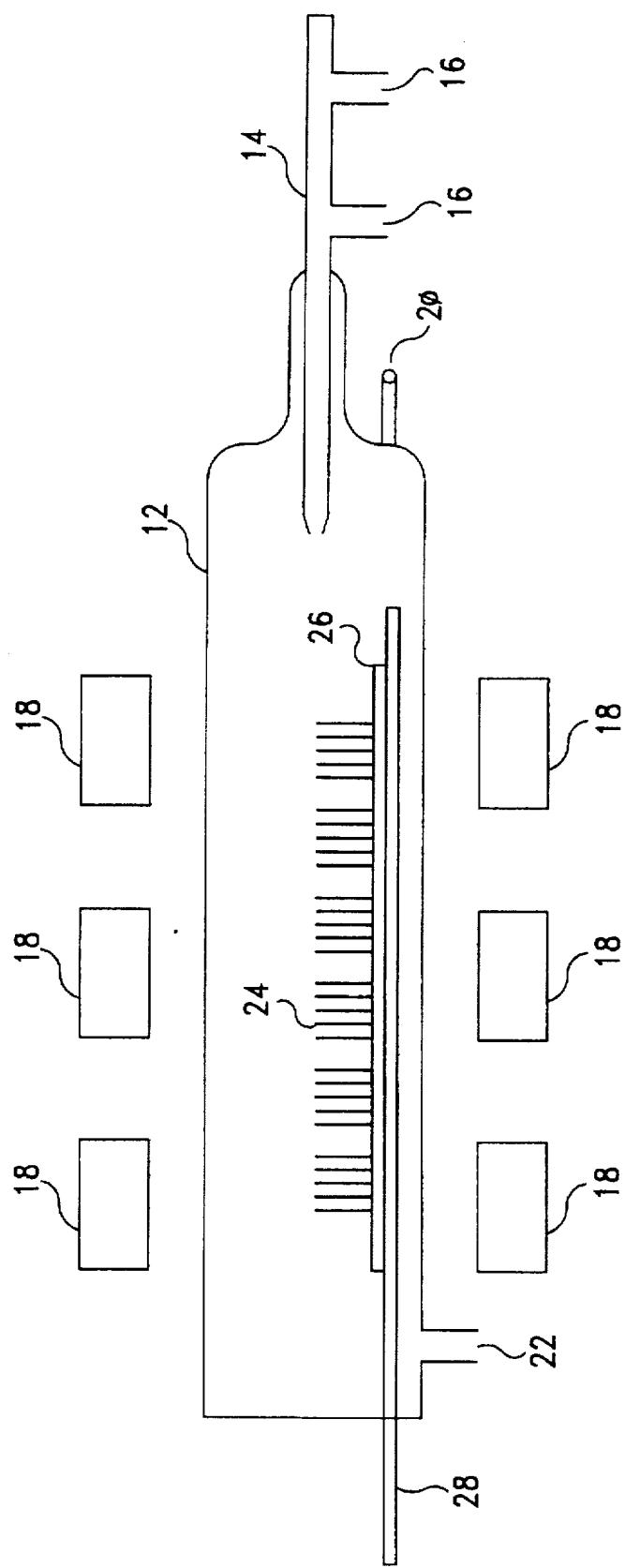
FIG. 1 is a cross section of a typical furnace.
Figure 2:
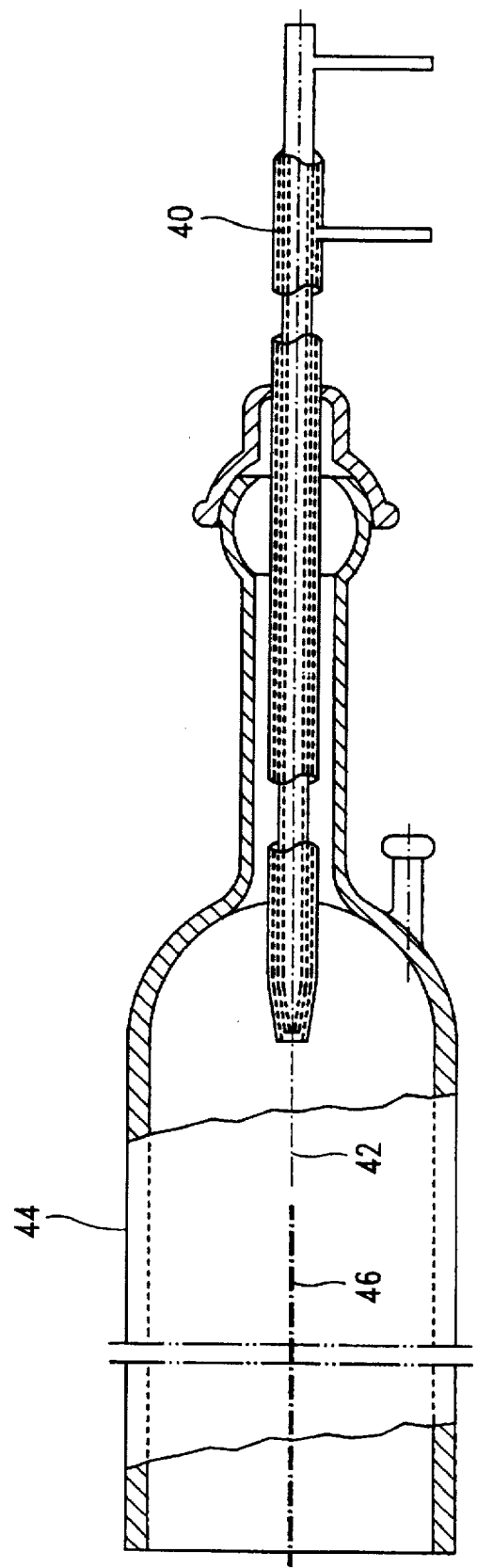
FIG. 2 is a cross section of a typical arrangement of a gas injector and a reaction tube.
Figure 3A:
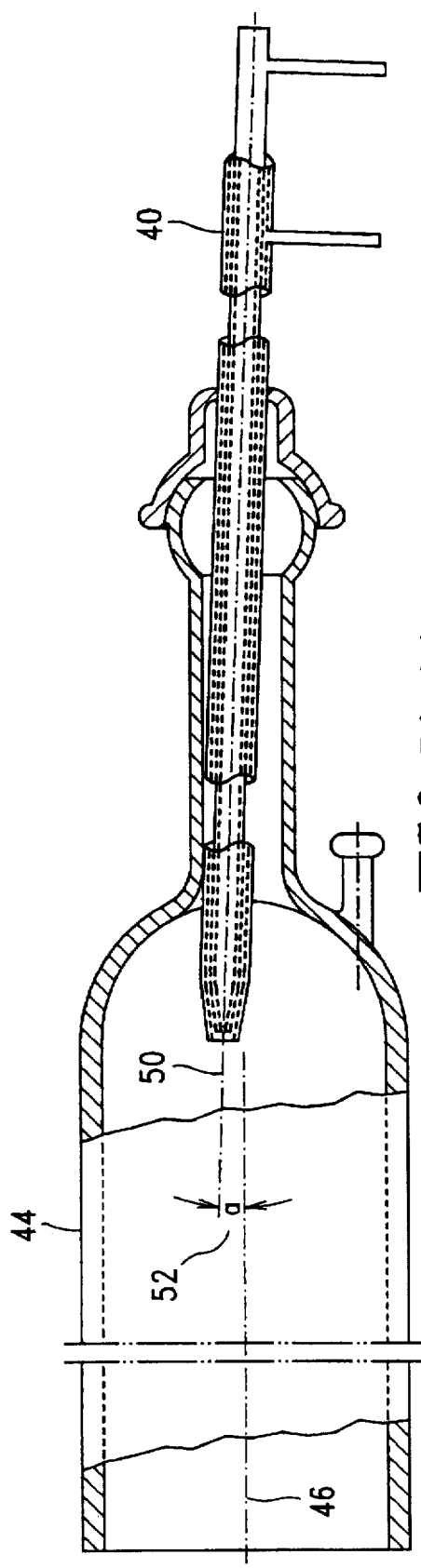
FIG. 3a is a cross section illustrating upward axial deviation in a typical furnace.
Figure 3B:
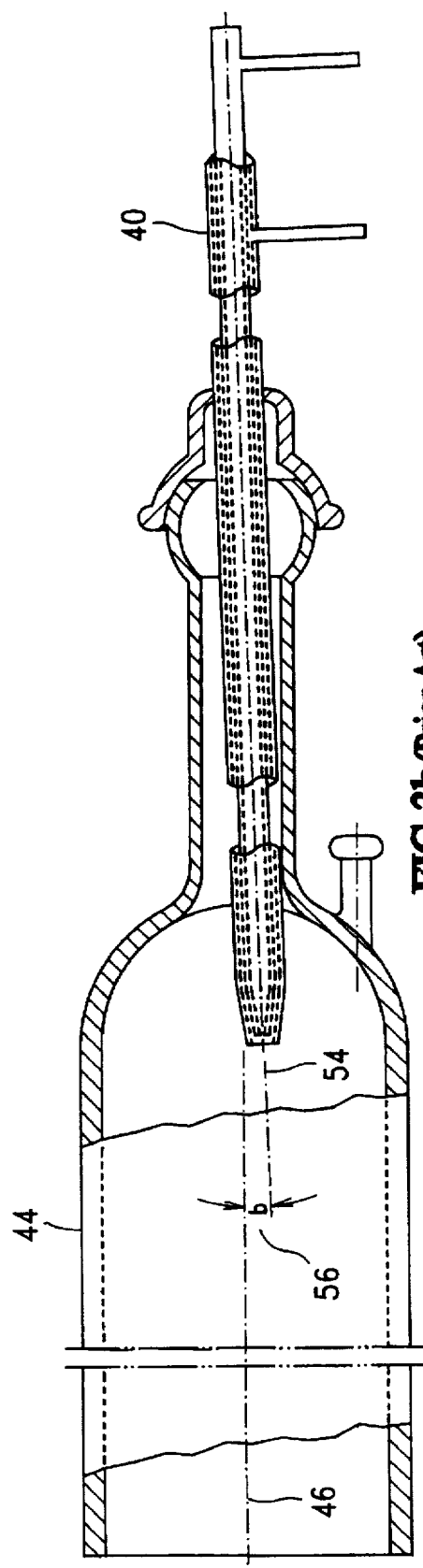
FIG. 3b is a cross section illustrating upward axial deviation in a typical furnace.

The furnace is becoming one of the major equipments in fabricating very large-scale integrated (VLSI) circuits by oxidation, diffusion and heat treating. When a silicon surface

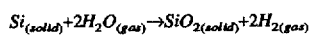

is exposed to oxygen by heating the wafer, called thermal oxidation, it is converted to silicon dioxide (SiO$_2$), which possesses good electrical characteristics and a thermal coefficient similar to that of silicon. Silicon dioxide layers are utilized in many uses such as field oxides, masking oxides, surface passivation, local oxidation (LOCOS) pad oxides, gate oxides, capacitor dielectrics and tunneling gates.

Typically, formation of the silicon dioxide layer takes place by one of the reactions shown below:

or

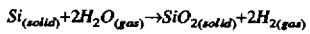

where the former formula, commonly called dry oxidation, creates a silicon dioxide layer with good electrical characteristics, simplicity and safety. However, the latter formula, commonly called wet oxidation, requires a shorter process time, where the water vapor (H$_2$O) results from the reaction of oxygen and hydrogen. The source gas includes hydrogen, oxygen, water, nitrogen, chlorine, trichloroethane (TCA), trichloroethylene (TCE), or TDCE, or a mixture thereof.

FIG. 4b shows a cross section of the invention, which comprises: a reaction tube 60 for protecting wafers (not shown in the diagram for simplicity) from outside contamination and for serving as a heat sink to even out the temperature; a gas injector 62 having its axis 64 superimposed approximately on axis 66 of the reaction tube 60, coupling to the reaction tube 60 on one end, and comprising two openings 68 on the other end for passing source gases into the reaction tube 60; an open tube 70 with two ends open, having its axis superimposed approximately on axis 64 of the gas injector 62, and including a first end 74 secured to the gas injector 62, and a second end 72 secured to the gas injector 62 near a position where the gas injector 62 is coupled to the reaction tube 60; and a thermocouple 76 attached to the reaction tube 60 for measuring and maintaining the desired process temperature.

Noticeably, as shown in FIG. 4a and FIG. 4b, the first end 74 of the open tube 70 is secured to the gas injector 62 by soldering between them at 3 points 90 surrounding the rim of the open tube 70, and each of the 3 points 90 is 120 degrees away from each other. The second end 72 of the open tube 70 is secured to the gas injector 62 by soldering between them surrounding the rim of the open tube 70.

Referring to FIG. 4a again, the outer radius of the open tube 70 is smaller than the inner radius near the neck portion 94 of the reaction tube 60 to accommodate the coarseness on surfaces of the open tube 70 and the reaction tube 60. Preferably, the difference Δx 96 between two radii is 0.5 mm.

The traditional material of the reaction tube 60, the gas injector 62 or the open tube 70 is high-purity quartz. Quartz is a highly purified glass favored for its inherent stability at high temperatures and its cleanliness. However, a drawback to quartz is its tendency to break up and sag at temperatures above 1200° C. An alternative material, which has limited use now due to its high cost and weight is silicon carbide, which is structurally stronger and does not break down with repeated heating and cooling.

Due to the improvement over typical furnaces, the present invention is practiced to grow layers of better uniformity in or on the semiconductor wafers in order to increase the reliability and yield of products.

In addition to the various processes applicable to the invention, usually, when practicing the invention to grow gate oxides of metal oxide semiconductor (MOS) devices, improvements in cleanliness and device performance are achieved when chlorine is incorporated into the oxide to reduce mobile ionic charges in the oxide layers, reducing structural defects in the oxide and on the silicon surface, and reducing charges at the oxide-silicon interface. The chlorine comes from hydrogen chloride (HCl), trichloroethane (TCA), trichloroethylene (TCE), or TDCE. Furthermore, the desired process temperature for forming silicon dioxide layers by utilizing this invention is about 900° to 1200° C. Generally, growing a layer with predetermined thickness requires shorter process time as temperature is increasing or, in other words, the layer becomes thicker during a predetermined time as temperature is increasing. The silicon dioxide layers used in silicon-based devices vary in thickness. Ranges of silicon dioxide layer thickness for the major uses are listed in Table 1 shown below:

TABLE 1

| Silicon Dioxide Thickness, Å(= 10$^{-10}$ m) | Application |
| --- | --- |
| 60–100 | Tunneling Gates |
| 150–500 | Gate Oxides, Capacitor Dielectrics |
| 200–500 | LOCOS Pad Oxides |
| 2,000–5,000 | Masking Oxides, Surface Passivation |
| 3,000–10,000 | Field Oxides |

The invention is utilized in heat treating as a follow-on operation, called annealing, to cure out crystal damage induced by the implant process, and a critical operation, called flowing, to increase the adhesion of a dielectric material to the silicon surface.

The apparatus shown in FIG. 4a and FIG. 4b is arranged horizontally, a style which has enjoyed great popularity over the years. An alternative arrangement, called vertical furnace, which offers the promise of more uniform processing by maintaining good laminar flow, though, still possesses the problem of a typical horizontal furnace. The present invention applies to a typical vertical furnace very well for eliminating the problem of axial deviation due to inaccuracy of adjustment.

Although specific embodiments have been illustrated and described it will be obvious to those skilled in the art that various modifications, such as variation of the number of soldering points, may be made without departing from the spirit which is intended to be limited solely by the appended claims.

What is claimed is:

1. An apparatus for adjusting a gas injector of a furnace in connection with oxidation, diffusion and heat treating in semiconductor processing, the apparatus comprising:

a reaction tube for protecting a plurality of wafers therein from outside contamination and serving as a heat sink to even out the temperature therein, the gas injector having an axis superimposed approximately on an axis of the reaction tube, the gas injector being coupled to the reaction tube on one end, the gas injector including at least one opening on the other end for passing source gas into the reaction tube; and an elongated open tube having an axis superimposed approximately on the axis of the gas injector, the elongated open tube including a first end secured to the gas injector and a second end secured to the gas injector at a joint where the gas injector is coupled to the reaction tube.

2. The apparatus according to claim 1, wherein said gas injector is made of quartz.

3. The apparatus according to claim 1, wherein said gas injector is made of silicon carbide.

4. The apparatus according to claim 1, wherein said elongated open tube is made of quartz.

5. The apparatus according to claim 1, wherein said elongated open tube is made of silicon carbide.

6. The apparatus according to claim 1, wherein said gas injector comprises two openings.

7. The apparatus according to claim 1, wherein said first end of the elongated open tube is secured to the gas injector by soldering between them at a plurality of points surrounding a rim of the elongated open tube.

8. The apparatus according to claim 7, wherein said first end of the elongated open tube is secured to the gas injector by soldering between them at three points surrounding the rim of the elongated open tube; each of the three points being 120 degrees away from each other.

9. The apparatus according to claim 1, wherein said second end of the elongated open tube is secured to the gas injector by soldering between them surrounding a rim of the elongated open tube.

10. The apparatus according to claim 1, wherein said source gas through the opening includes one of the group consisting of hydrogen, oxygen, water, nitrogen, chlorine, trichloroethane_(TCA), trichloroethylene_(TCE), TDCE or a mixture thereof.

11. The apparatus according to claim 1, wherein said source gas includes hydrogen and oxygen, said source gas being reacted within the reaction tube at a temperature of about 900° to 1200° C.

12. The apparatus according to claim 1, wherein said source gas is oxygen, said source gas being reacted within the reaction tube at a temperature of about 900° to 1200° C.

13. The apparatus according to claim 1, wherein an outer radius of said elongated open tube is shorter than an inner radius of a neck portion of said reaction tube.

14. The apparatus according to claim 13, wherein difference of said radii is about 0.5 mm.

15. The apparatus according to claim 1, further comprising a thermocouple attached to said reaction tube for measuring temperature therein.

16. The apparatus according to claim 1, wherein said reaction tube, said gas injector, and said elongated open tube are arranged in a horizontal manner.

* * * * *